United States Patent
Eriksson et al.

(10) Patent No.: US 10,328,807 B2
(45) Date of Patent: Jun. 25, 2019

(54) METHOD FOR OPERATING A BATTERY CHARGER, AND A BATTERY CHARGER

(71) Applicant: CTEK Sweden AB, Vikmanshyttan (SE)

(72) Inventors: Per Eriksson, Borlange (SE); Linus Eriksson, Borlange (SE); Hans-Olof Frojd, Gavle (SE)

(73) Assignee: CTEK Sweden AB, Vikmanshyttan (SE)

( * ) Notice: Subject to any disclaimer, the term of this patent is extended or adjusted under 35 U.S.C. 154(b) by 17 days.

(21) Appl. No.: 15/557,524

(22) PCT Filed: Mar. 16, 2016

(86) PCT No.: PCT/SE2016/050212
§ 371 (c)(1),
(2) Date: Sep. 12, 2017

(87) PCT Pub. No.: WO2016/148630
PCT Pub. Date: Sep. 22, 2016

(65) Prior Publication Data
US 2018/0050598 A1    Feb. 22, 2018

(30) Foreign Application Priority Data
Mar. 16, 2015    (SE) ..................... 1550312

(51) Int. Cl.
*H02J 7/00* (2006.01)
*B60L 11/18* (2006.01)
(Continued)

(52) U.S. Cl.
CPC ....... *B60L 11/1812* (2013.01); *B60L 11/1816* (2013.01); *G01R 31/36* (2013.01);
(Continued)

(58) Field of Classification Search
CPC .................................................. B60L 11/1812
(Continued)

(56) References Cited

U.S. PATENT DOCUMENTS

| 5,160,880 | A | 11/1992 | Palanisamy | |
|---|---|---|---|---|
| 6,037,751 | A * | 3/2000 | Klang | H01M 10/44 320/129 |
| 7,345,453 | B2 * | 3/2008 | Atehortua | G01R 31/3679 320/134 |
| 7,528,579 | B2 * | 5/2009 | Pacholok | H02J 7/022 320/145 |
| 7,898,220 | B2 * | 3/2011 | Guang | H02J 7/0077 320/135 |

(Continued)

FOREIGN PATENT DOCUMENTS

| EP | 1 835 297 A1 | 9/2007 |
|---|---|---|
| JP | 2007-166789 A | 6/2007 |

(Continued)

OTHER PUBLICATIONS

International Search Report for corresponding International Application No. PCT/SE2016/050212 dated Jun. 30, 2016.
(Continued)

*Primary Examiner* — Yalkew Fantu
(74) *Attorney, Agent, or Firm* — Renner, Otto, Boisselle & Sklar, LLP

(57) ABSTRACT

The present invention relates to a method for operating a battery charger, and a battery charger. The method comprising the steps of determining a capacity of the battery, determining an initial charging current, apply the calculated initial charging current as a charging current to the battery, determining the voltage change with time $\Delta V/\Delta t$ for the voltage over the battery, adjusting the charging current based on the $\Delta V/\Delta t$.

20 Claims, 4 Drawing Sheets

(51) Int. Cl.
  *G01R 31/36* (2019.01)
  *H02J 7/04* (2006.01)
  *G01R 31/388* (2019.01)
  *G01R 31/389* (2019.01)
  *H01M 10/44* (2006.01)
  *H02J 7/08* (2006.01)

(52) U.S. Cl.
  CPC ......... *G01R 31/388* (2019.01); *G01R 31/389* (2019.01); *H02J 7/0008* (2013.01); *H02J 7/0029* (2013.01); *H02J 7/0086* (2013.01); *H02J 7/045* (2013.01); *B60L 11/1861* (2013.01); *H01M 10/44* (2013.01); *H02J 7/0047* (2013.01); *H02J 7/085* (2013.01); *H02J 2007/0039* (2013.01); *H02J 2007/0049* (2013.01); *Y02T 10/7005* (2013.01); *Y02T 10/7072* (2013.01); *Y02T 90/127* (2013.01); *Y02T 90/14* (2013.01)

(58) Field of Classification Search
  USPC .......................................................... 320/109
  See application file for complete search history.

(56) References Cited

U.S. PATENT DOCUMENTS

| | | |
|---|---|---|
| 2001/0000212 A1 | 4/2001 | Reipur et al. |
| 2004/0130297 A1* | 7/2004 | Baeuerlein ......... G01R 31/3662 320/137 |
| 2008/0191667 A1* | 8/2008 | Kernahan ............. H01M 10/44 320/150 |

FOREIGN PATENT DOCUMENTS

| | | |
|---|---|---|
| WO | 2002/097456 A2 | 12/2002 |
| WO | 2003/0303331 A1 | 4/2003 |

OTHER PUBLICATIONS

Written Opinion of the International Searching Authority for corresponding International Application No. PCT/SE2016/050212 dated Jun. 30, 2016.
Extended European Search Report in corresponding European Application No. 16765344.3 dated Feb. 7, 2018.

* cited by examiner

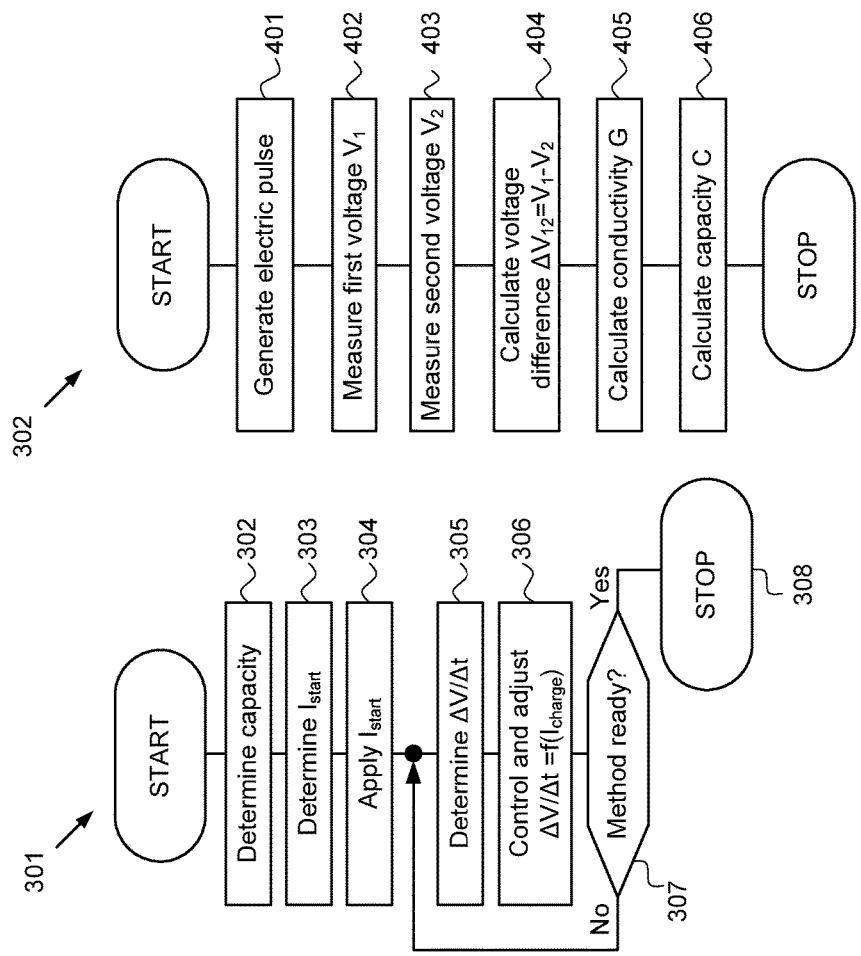

ical Field

METHOD FOR OPERATING A BATTERY CHARGER, AND A BATTERY CHARGER

This application is a national phase of International Application No. PCT/SE2016/050212 filed Mar. 16, 2016 and published in the English language, which claims priority to SE Application No. 1550312-1 filed Mar. 16, 2015.

TECHNICAL FIELD

The present invention relates to a method for operating a battery charger. In particular, the present invention relates to method for charging of a connectable battery, and a battery charger therefor.

BACKGROUND

A conventional battery charger has a voltage converter configured to convert an incoming supply voltage to an output voltage suitable for a connectable battery. The current delivered to the battery from the voltage converter is a function of the output resistance of the battery charger and the resistance of the battery. This means that a battery charger with a low output resistance will deliver a high amount of output current without too much output voltage losses. A high amount of output current is desired when the battery is large with a low resistance. However, if a small battery is connected to a powerful battery charger several problems arise, such as for example overheating of the battery due to a large charging current.

Within the field of battery technology it is common to use a specific notation for currents and capacities. The capacity of a battery is normally given as amperexhours [Ah]. A small lead acid battery might have a capacity C=12 Ah. A common way to describe a given current is to use the notation C/X, where X=1 ... 100 hours. For example if this small battery is discharged at C/20 hours rate, the discharge current from the battery would be 12 Ah/20 h=0.6 A. For comparison, if a large battery with a capacity of 180 Ah is discharged at the same C/20 rate, the discharge current would be 180 Ah/20 h=9 A. Thus by expressing the current as C/20, the current becomes a function of the battery capacity, which is suitable for comparing batteries with different sizes and capacities.

In a modern workshop it is convenient to have one battery charger configurable for charging all types of batteries and all battery sizes from small motorcycle batteries (12 Ah) to large truck batteries (180 Ah). In a conventional workshop battery charger it is common that the charging current must be manually selected and a rule of thumb for calculating the charging current is that the charging current could be C/10, i.e. 10% of the battery capacity. This means that for a 75 Ah battery the charging current should be adjusted to 7.5 A. In order to fully charge a 75 Ah battery, 10 hours at 7.5 A is required using a simple rule of thumb for calculation, not including the current state of charge of the battery. If a service technician by mistake connects the battery charger which is adjusted for a truck battery, to a much smaller battery a very dangerous situation would occur that in best case could lead to a damaged battery and in worst case could lead to a fire in the workshop or in the vehicle.

This rough estimation of charging current and charging time, based on the rule of thumbs described above does not take into account the current state of charge of the battery. Therefore, it is easy to overcharge the battery with the associated evolution of gas from the battery.

It is therefore of great importance to find a solution that could prevent this disastrous situation by means of automatically adjusting the charging current and time.

An example of an adaptive battery charger is disclosed in U.S. Pat. No. 5,160,880. However, the method disclosed in U.S. Pat. No. 5,160,880 is very slow due to the determination of the gas point of the connected battery.

It is an object of the present invention to provide an improved method for charging the battery.

A further object is to provide a more optimum charging method that reduces the risk of increased gas emission and overheating of the battery, as well as a battery charger therefor.

An additional object is to provide a fast method for charging a battery, as well as a battery charger therefore.

SUMMARY OF THE INVENTION

One or more of the above objects, and further possible objects that can be construed from the disclosure below, are met by a first aspect of the invention constituted by a method for operating a battery charger configured to be connected to a battery, comprising: connecting the battery to the battery charger, determining a capacity of the battery, determining an initial charging current, and applying the determined initial charging current as a charging current to the battery, and wherein the method further comprises: determining the voltage change with time $\Delta V/\Delta t$ for the voltage over the battery, and adjusting the charging current based on the $\Delta V/\Delta t$.

The above objects and further possible objects are further met by a second aspect of the invention constituted by a battery charger comprising: a voltage converter configured to convert an input voltage to an output voltage, the voltage converter further being connected to an output means configured to be connected to a battery. The battery charger further comprises: a processor and a memory, wherein the memory contains instructions for executing the method according to the first aspect of the invention, and the processor is configured to execute said instructions, and wherein the processor further comprises means for controlling the voltage converter, and means for detecting the output voltage and the output current of the output means.

Additional or alternative features of the first aspect are described below.

The method comprises determining the capacity of the battery, which may involve: generating an electrical pulse across a plus pole and a minus pole of the battery; measuring a first voltage (V1) across the plus pole and the minus pole at a first time during said pulse; measuring a second voltage (V2) across the plus pole and the minus pole at a second time after said pulse; calculating a voltage difference ($\Delta V_{12}$) between said first voltage and said second voltage; calculating a conductivity (G) of the battery according to: $G=I_{pulse}/\Delta V_{12}$ where $I_{pulse}$ is the current of the electrical pulse; calculating a capacity (Q) of the battery according to: $Q=q(G)$, where $q(G)$ is a capacity function that gives the capacity (Q) of the battery for a given conductivity (G). This has the effect that by applying an electrical pulse to the connected battery, a reliable measurement of the capacity is obtained. Furthermore, the capacity of the connected battery may be obtained within the first seconds after connecting the battery charger to the battery.

The electrical pulse may be a constant current pulse. Since the method involves controlling the output current this has the effect of being easily integrated into the method, also a constant current pulse protects the circuit from outputting potentially damaging current levels if it is connected to a low resistance path.

Furthermore, the constant current pulse may have a predetermined duration in time. This has the effect that the time needed to determine the capacity of the battery can be precisely estimated. In addition, an output of a constant current pulse with a predetermined duration is easily generated by a processor.

The predetermined duration in time may, for example be in the interval from 15 seconds up to 90 seconds. This has the effect that the time needed for determining the capacity of the connected battery may become short.

The first time may be at an end of the electrical pulse. This has the effect that the determination of the capacity may be executed as fast as possible. However, in some embodiments it may be useful to determine an average of the output voltage and in that case the first time might be somewhere in the time period used for determining the average output voltage.

The second time may be at a predetermined time length from said first time. This has the effect that the method is easy to implement.

The capacity function may be a linear function of the conductivity $q(G)=k \times G$, where k is a battery constant. This has the effect of fast implementation due to the multiplication with the battery constant.

The battery constant k may depend on the chemistry of the battery.

The capacity function may comprise a linear function of the conductivity. This has the effect that a limited region could be implemented as a piecewise linear function of the conductivity.

The step of adjusting the charging current may involve using a proportional controller. This also has the effect of easy and robust implementation.

The step of adjusting the charging current may comprise: if it is determined that the voltage change with time $\Delta V/\Delta t$ is smaller than a predetermined rate of change, increase the charging current, if it is determined that the voltage change with time $\Delta V/\Delta t$ is larger than the predetermined rate of change, decrease the charging current.

The predetermined rate of change may, for example be in the interval from 1 mV/min to 100 mV/min. This has the effect that both a fast charging profile and a slow charging profile are possible to achieve by selecting a predetermined rate of change from the interval.

The predetermined rate of change may, for example be in the interval from 5 mV/min to 50 mV/min.

The method may further comprise: determining the voltage of the battery, and if it is determined that the voltage of the battery is equal to a voltage indicative of a fully charged battery, exiting the method. This has the effect of a simple and robust criterion for interrupting the method when a predetermined output voltage is reached.

The calculation of the initial charging current may comprise dividing the determined capacity of the battery with a charging constant. This has the effect that a suitable initial charging current is easily calculated from the determined capacity of the battery.

The charging constant may be in the range from 0.1 to 100 hours. By selecting a charging constant from this range it is possible to obtain a desired charging profile, such as a fast profile, a normal profile and a slow profile that prevents unnecessary heating.

Other objects, advantages and features of embodiments of the invention will be explained in the following detailed description in conjunction with the accompanying drawings.

BRIEF DESCRIPTION OF DRAWINGS

FIG. 3 is a flowchart illustrating a method for operating a battery charger,

FIG. 4 is a flowchart illustrating a method for determining a capacity of the connected battery.

DETAILED DESCRIPTION

Figure 1:
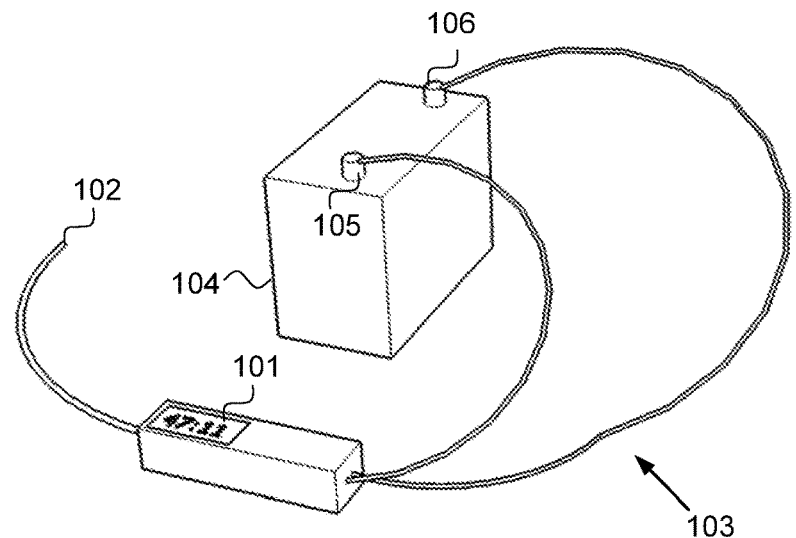
FIG. 1 illustrates a battery charger and a connectable battery.

In a first embodiment of the present invention shown in FIG. 1, a battery charger 101 is illustrated. The battery charger 101 has a mains cable 102 for receiving incoming power, and an output means 103 configured to be connected to a minus pole 106 and a plus pole 105 of a battery 104. In this figure the battery is shown in a standalone position. However, the embodiments of the invention disclosed below are equally suitable for use with a battery connected to a vehicle.

In the following, it is assumed that the surrounding temperature is 25° C. The battery charger 101 furthermore comprises a temperature sensor provided for sensing the temperature. The battery charger also comprises means for temperature compensating the sensed and applied voltages of the battery charger.

Figure 2:
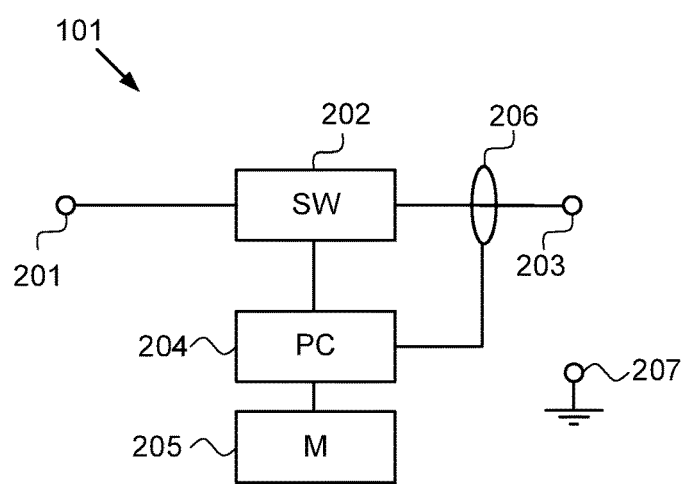
FIG. 2 illustrates a schematic block diagram of a battery charger.

Now with reference made to FIG. 2 a block diagram of the battery charger 101 will be disclosed. The battery charger 101 has an input terminal 201 connected to the mains cable 102 for supplying a voltage converter 202 with electrical power. The voltage converter 202 may be a switched converter (SW) or a linear converter. An output of the voltage converter 202 is further connected to an output terminal 203 for output of electrical power to the output means 103. The output means 103 connects the output terminal 203 to the plus pole 105 of the battery, and a ground terminal 207 of the battery charger 101 to the minus pole 106 of the battery 104.

The battery charger 101 has a processor 204 (PC) configured to control the voltage converter 202. This control may involve controlling the duty cycle of a switching signal if the voltage converter 202 is a switched voltage converter. It may also comprise a current limit signal for controlling the maximum output current from the voltage converter 202. The processor 204 is further connected to an output circuit 206, wherein the output circuit 206 is configured to measure the output current and the output voltage of the output terminal 203.

In an alternative embodiment, the output circuit 206 may comprise a current sensor that measures the output current flowing into the ground terminal 207, a so called low side current sensor (not shown in the figure).

The battery charger 101 further comprises a memory 205 comprising a control program, which is executed by the processor 204 during operation of the battery charger 101. The control program contains instructions for operating and controlling the battery charger 101.

The processor 204 and the memory 205 may be integrated into a so called microcontroller, together with other peripheral components such as DA/AD converters and ports for I/O.

In FIG. 3 a method 301 for operating the battery charger 101 is disclosed as a flowchart. The method 301 comprises several steps disclosed below.

In a first step 302 a capacity of the connected battery 104 is determined. The capacity of the battery 104 can be determined in many different ways. A simple solution is to request the capacity of the battery as input from the user of the battery charger 101 by means of for example a keyboard or a button. This is of course a possible source of error if the wrong battery capacity is entered as input. Therefore, an automatic determination of the battery capacity would be much safer and user friendlier. Such a determination of the battery capacity will be discussed later with reference made to the flowchart in FIG. 4.

After the capacity is determined a second step 303 is executed, which involves determining the initial charging current $I_{start}$. Several different rules of thumb exist for calculating the starting current, and a common rule of thumb is to use a current equal to 10% of the capacity of the battery (C/10 h rate). For example, if the capacity is 75 Ah a suitable initial charging current would be 7.5 A.

The initial charging current $I_{start}$ may also be changed through a selection of fast, normal, or energy saving mode of charging. In the fast charging mode the $I_{start}$ is aggressively adjusted to a high value, in the normal mode of charging a more reasonable setting is used, and in the energy mode a low current is used that avoids heating of the battery 104 and the battery charger 101.

In one embodiment the 5 h rate may be used for an initial charging current $I_{start}=C/5$ in a fast charging profile.

In one embodiment the 10 h rate may be used for an initial charging current $I_{start}=C/10$ in a normal charging profile.

In one embodiment the 20 h rate may be used for an initial charging current $I_{start}=C/20$ in an energy saving charging profile.

After the second step 303 a third step 304 is executed, this third step 304 involving maneuvering the voltage converter 202 to output the determined initial charging current as a charging current to the connected battery 104.

The third step 304 may also comprise a waiting time after the determined initial charging current is applied to the connected battery. This waiting time may be in the order of some minutes, and in one embodiment the waiting time is approximately equal to 10 minutes. In other embodiments the waiting time is in the interval from 10 to 20 minutes. The reason for this waiting time will be explained later with reference made to FIG. 6B.

The resulting output voltage over the minus pole 106 and the plus pole 105 is then measured in a fourth step 305. The output voltage is measured during a predetermined sampling time in order to achieve a reliable estimate of the rate of change of the output voltage.

In one embodiment the output voltage is measured once per second for five minutes. This seems to generate a reasonable stable approximation of the rate of change for the output voltage.

The fourth step 305 is followed by a fifth step 306, in which the charging current is adjusted to obtain a predetermined rate of change of the output voltage $\Delta V/\Delta t$. The charging current may be controlled by a PID regulator or a proportional regulator in order to achieve the desired rate of change for the output voltage $\Delta V/\Delta t$.

The desired rate of change for the output voltage $\Delta V/\Delta t$ can be derived from the open circuit voltage over the poles of the connected battery. If the open circuit voltage is equal to Vo and the gassing voltage Vg for the battery is known, the rate of charge can be used for calculating the necessary $\Delta V/\Delta t$. For example a lead acid battery has an open circuit voltage Vo=11.5 V and a gassing voltage Vg=14.34 V (6×2.39 V/cell). If a 5-h rate is desired for charging the battery the necessary voltage change with time $\Delta V/\Delta t$ can be calculated as: $\Delta V/\Delta t=(14.34-11.5)/(5\times60)=10$ mV/min. A more aggressive charging can be obtained by means of using a 3-h rate.

In a sixth step 307 it is determined if the connected battery has reached a predetermined level of charge. If it is determined that the level of charge has reached the predetermined level of charge, the inventive method ends in a seventh step 308. If it is determined that the predetermined level of charge is not reached, the process jumps back to the fourth step 305 which is executed again followed by the fifth step 306 and the sixth step 307.

The sixth step 307 may in one embodiment involve checking if the output voltage is at an inflection point. An inflection point is defined in the context of this application as a point wherein the rate of change of the output voltage exhibits a sudden change.

This check for an inflection point may in one embodiment be used to identify whether an inflection point is present at an output voltage equal to 13.5 V and if no inflection point is identified the charging continues until the output is equal to 24 V. This means that the method can identify if a 24 V battery is connected to the battery charger. If an inflection point is found at 13.5 V, the process may continue to an output voltage of 14.4 V, and a subsequent absorption charging step may be performed.

The sixth step 307 may in one embodiment involve checking if the output voltage has exceeded or is equal to a predetermined output voltage. This predetermined output voltage may in one embodiment be equal to 14.2 V, which is suitable for a 12 V lead acid battery.

Now with reference made to a flowchart in FIG. 4, an embodiment of the first step 302 of determining the capacity of the connected battery 104 will be disclosed.

The determining of the capacity 302 comprises the following steps:

401: Generating an electrical pulse across a plus pole and a minus pole of the connected battery 104.

402: Measuring a first voltage (V1) across the plus pole and the minus pole at a first time during said pulse.

403: Measuring a second voltage (V2) across the plus pole and the minus pole at a second time after said pulse.

404: Calculating a voltage difference ($\Delta V_{12}$) between said first voltage and said second voltage.

405: Calculating a conductivity (G) of the battery according to: $G=I_{pulse}/\Delta V_{12}$, where $I_{pulse}$ is the current of the electrical pulse.

406: Calculating a capacity (C) of the battery according to: $C=q(G)$, where $q(G)$ is a capacity function that gives the capacity (C) of the battery for a given conductivity (G).

The relation between the capacity and the conductivity may in one embodiment be a linear relation. In other embodiments the relation may be non-linear, for example the relation may be exponential in one embodiment. The relation may also be dependent on the type of battery used, i.e. the relation for a lead acid battery may be different compared to a NiCd battery. In one embodiment the relation between capacity and conductivity is obtained by means of testing different batteries of the same type with different capacities.

This method for determining the capacity C of the connected battery is further described below with reference made to FIG. 5A. This figure is a real measurement performed on a conventional lead acid battery connected to a battery charger according to the first embodiment.

Figure 5A:
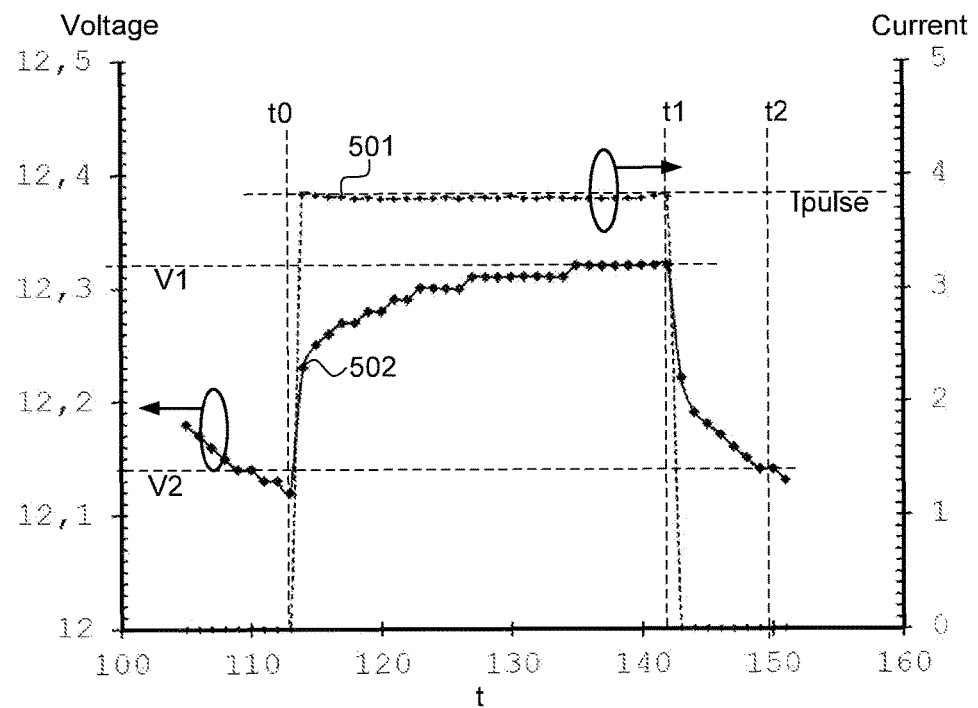
FIG. 5A-B are graphs illustrating the method for determining the capacity of a connected battery.

At time t0 in FIG. 5A a constant current pulse 501 is applied to a connected battery. During this current pulse the voltage 502 across the plus pole and the minus pole of the connected battery increases. This voltage is measured and is used as the first voltage (V1). In this embodiment the measurement of V1 is performed just before time t1 when the current pulse is turned off. The voltage across the poles of the battery decreases and at time t2 the second voltage (V2) across the poles of the connected battery is measured. In another embodiment the second voltage can be measured when the voltage across the poles has decreased to a predetermined value. All measurements needed to calculate the capacity of the battery have now been performed, and the remaining steps of calculating the conductivity and the capacity are easily performed. In this embodiment a constant current pulse with amplitude of 3.8 A and duration of 30 s is used.

Figure 5B:
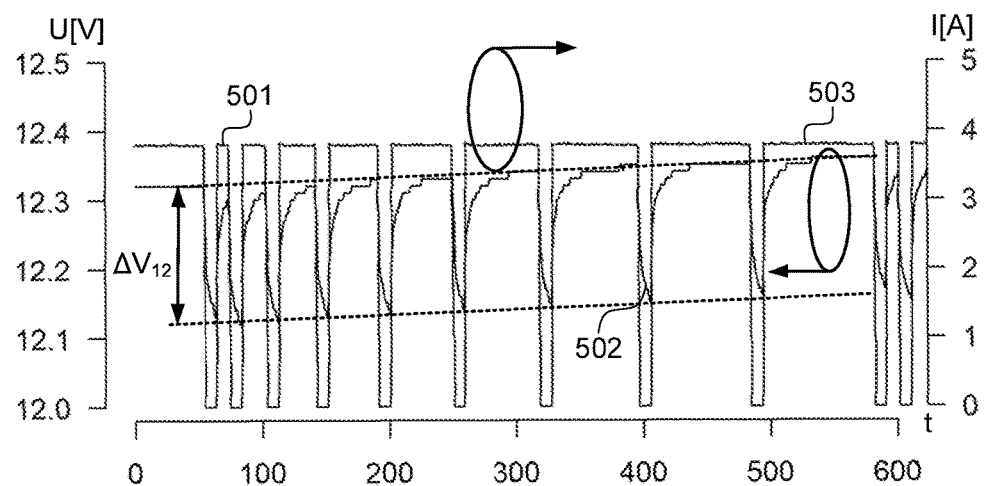

In order to further explain the inventive method a sweep with increasing pulse duration is shown in FIG. 5B. The battery charger used for generating the curves in FIG. 5B has been modified for sweeping the duration of the output pulses. The amplitude of the current pulse is 3.8 A and the duration is increased in steps of 10 seconds, from a pulse length 501 of 10 seconds up to a pulse length 503 of 90 seconds. From FIG. 5B it is evident that the voltage across the poles of the battery reaches an almost constant value after approximately 20 seconds. Therefore, in order to achieve a fast estimate of the capacity the pulse duration of 20 seconds may be used, but of course longer pulses may also be used in other embodiments. The time interval between the current pulses is in this figure FIG. 5B set to 10 seconds. Based on the voltage curve 502 in FIG. 5B this seems to be a reasonable time interval in order to allow the voltage between the poles of the battery to return to a reasonable level. From FIG. 5B it is also noticed that the voltage difference $\Delta V_{12} = V1 - V2$ is independent of the state of charge (SOC) of the battery. This is indicated as dotted lines in the FIG. 5B, the constant voltage difference in the FIG. 5B $\Delta V_{12}$ indicating that this voltage difference $\Delta V_{12}$ is independent of the SOC.

This means that the method can be used regardless of the SOC of the battery, which is of great importance.

In the following an experiment will be disclosed that illustrates the invention. In the experiment a lead acid battery will be charged with a battery charger according to the first embodiment of the invention.

The battery charger 101 has a memory comprising instructions implementing the second embodiment of the invention and the third embodiment of the invention.

The lead acid battery used in this experiment has a capacity of 75 Ah. This capacity corresponds to a conventional car battery. Before each measurement the battery was discharged to a low state of charge (SOC).

Figure 6A:
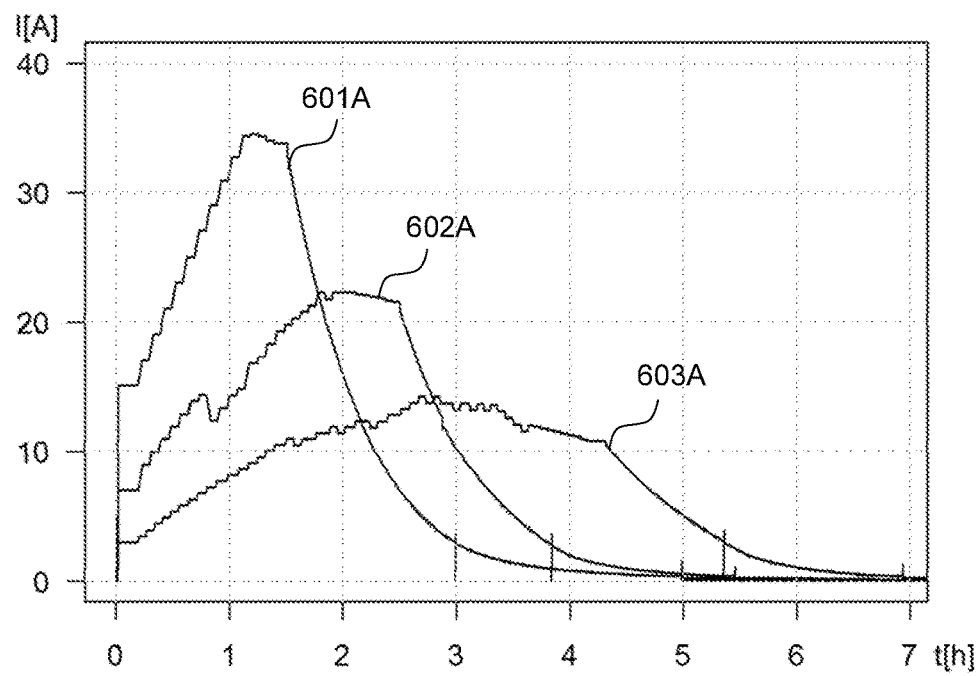
FIG. 6A-B are graphs illustrating an experiment.
Figure 6B:
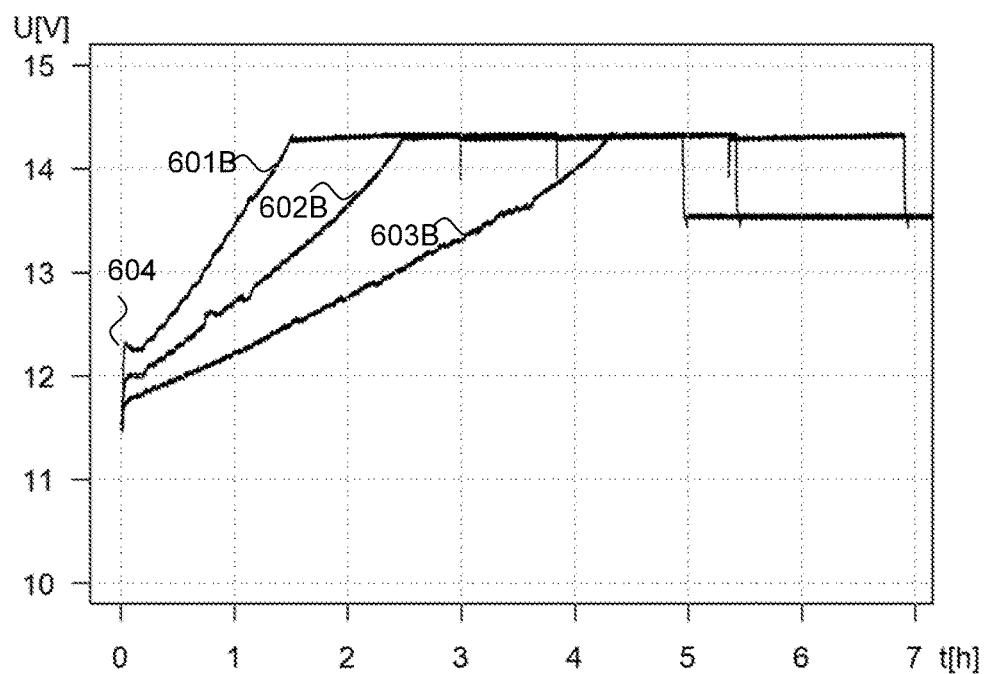

The experiment, illustrated in FIG. 6A shows the output current from the battery charger 101 for three different charging profiles. A corresponding FIG. 6B shows the resulting output voltage for the corresponding current curves in FIG. 6A.

A first profile corresponding to an accelerated charging profile is shown as a first current curve 601A. The first current curve 601A has a corresponding first voltage curve 601B shown in FIG. 6B.

The first current curve 601A shows that the battery charger 101 has determined an initial charging current of 15 A. This corresponds to a time constant C=5 hours and a determined capacity of 75 Ah. The set value for the rate of change for the output voltage $\Delta V/\Delta t$ is for this curve 25 mV/min. A maximum output current of 34 A can be seen in the first current curve 601A.

A second current curve 602A corresponds to a normal charging profile. The initial charging current is 7.5 A and the rate of change for the output voltage $\Delta V/\Delta t$ is for this second voltage curve 602B 15 mV/min.

A third current curve 603A corresponds to an energy saving charging profile. The initial charging current is 3 A and the rate of change for the output voltage $\Delta V/\Delta t$ is for this third voltage curve 603B 7.5 mV/min.

In this experiment a voltage increase 604 is noticed when the initial charging current is applied to the battery. In order to provide stable conditions the battery charger is in this embodiment instructed to wait 12 minutes after applying the initial charging current before the process continues.

From these experiments, illustrated in FIG. 6A and FIG. 6B, it can be concluded that the method according to the second aspect of the invention and the battery charger according to the first aspect of the invention perform very well.

The invention claimed is:

1. A method for operating a battery charger configured to be connected to a battery, comprising the steps of:
   connecting the battery to the battery charger;
   determining a capacity (C) of the battery, wherein the step of determining the capacity (C) of the battery comprises applying an electrical pulse to the connected battery, calculating a conductivity (G) of the battery using a voltage difference ($\Delta V_{12}$) between a first voltage (V1) and a second voltage (V2) measured during and after said pulse and calculating the capacity (C) using a capacity function that determines the capacity (C) of the battery for the given conductivity (G);
   determining an initial charging current using the capacity (C) of the battery;
   applying the determined initial charging current as a charging current to the battery;
   determining the voltage change with time $\Delta V/\Delta t$ over the battery;
   adjusting the charging current based on the voltage change with time $\Delta V/\Delta t$ to obtain a predetermined rate of change of the output voltage $\Delta V/\Delta t$.

2. The method according to claim 1, wherein the step of determining the capacity (C) of the battery further comprises:
   generating the electrical pulse across a plus pole and a minus pole of the battery;
   measuring the first voltage (V1) across the plus pole and the minus pole at a first time during said pulse;
   measuring the second voltage (V2) across the plus pole and the minus pole at a second time after said pulse;
   calculating the voltage difference ($\Delta V_{12}$) between said first voltage and said second voltage;
   calculating the conductivity (G) of the battery according to: $G = I_{pulse}/\Delta V_{12}$ where $I_{pulse}$ is the current of the electrical pulse;

calculating the capacity (C) of the battery according to: C=q(G), where q(G) is a capacity function that gives the capacity (C) of the battery for a given conductivity (G).

3. The method according to claim 2, wherein the electrical pulse is a constant current pulse.

4. The method according to claim 3, wherein the constant current pulse has a predetermined duration.

5. The method according to claim 4, wherein the constant current pulse has a predetermined duration larger than 15 seconds.

6. The method according to claim 5, wherein the constant current pulse has a predetermined duration in an interval from 15 seconds up to 30 seconds.

7. The method according to claim 2, wherein the first time is at an end of the electrical pulse.

8. The method according to claim 2, wherein the second time is at a predetermined time length from said first time.

9. The method according to claim 2, wherein the capacity function is a linear function of the conductivity q(G)=k×G, where k is a battery constant.

10. The method according to claim 9, wherein the battery constant k depends on the battery chemistry of the battery.

11. The method according to claim 2, wherein the capacity function comprises a linear function of the conductivity.

12. The method according to claim 2, further comprising: determining the voltage of the battery;
if it is determined that the voltage of the battery is equal to a voltage indicative of a fully charged battery, exit the method.

13. A battery charger comprising:
a voltage converter configured to convert an input voltage to an output voltage, the voltage converter is further connected to an output means configured to be connected to a battery;
a processor and a memory, wherein the memory comprises instructions for executing the method according to claim 2 when the battery charger is connected to the battery, and the processor is configured to execute said instructions, and wherein the processor further comprises means for controlling the voltage converter, and means for detecting the output voltage and the output current of the output means.

14. The method according to claim 1, wherein the step of adjusting the charging current involves using a proportional controller.

15. The method according to claim 14, wherein the predetermined rate of change is in the interval from 1 mV/min to 100 mV/min.

16. The method according to claim 14, wherein the predetermined rate of change is in the interval from 5 mV/min to 50 mV/min.

17. The method according to claim 1, wherein the step of adjusting the charging current, comprises:
if it is determined that the voltage change with time $\Delta V/\Delta t$ is smaller than a predetermined rate of change, increasing the charging current;
if it is determined that the voltage change with time $\Delta V/\Delta t$ is larger than the predetermined rate of change, decreasing the charging current.

18. A battery charger comprising:
a voltage converter configured to convert an input voltage to an output voltage, the voltage converter is further connected to an output means configured to be connected to a battery;
a processor and a memory, wherein the memory comprises instructions for executing the method according to claim 17 when the battery charger is connected to the battery, and the processor is configured to execute said instructions, and wherein the processor further comprises means for controlling the voltage converter, and means for detecting the output voltage and the output current of the output means.

19. The method according to claim 1, further comprising: determining the voltage of the battery;
if it is determined that the voltage of the battery is equal to a voltage indicative of a fully charged battery, exit the method.

20. A battery charger comprising:
a voltage converter configured to convert an input voltage to an output voltage, the voltage converter is further connected to an output means configured to be connected to a battery;
a processor and a memory, wherein the memory comprises instructions for executing the method according to claim 1 when the battery charger is connected to the battery, and the processor is configured to execute said instructions, and wherein the processor further comprises means for controlling the voltage converter, and means for detecting the output voltage and the output current of the output means.

* * * * *